United States Patent [19]

McGeary

[11] Patent Number: 5,206,713

[45] Date of Patent: Apr. 27, 1993

[54] MOUNTING SILICON CHIPS

[75] Inventor: Michael L. McGeary, Alloway, Scotland

[73] Assignee: Digital Equipment Corporation, Maynard, Mass.

[21] Appl. No.: 722,741

[22] Filed: Jun. 28, 1991

[30] Foreign Application Priority Data

Jun. 29, 1990 [GB] United Kingdom ............... 9014491

[51] Int. Cl.⁵ .......................................... H01L 39/02
[52] U.S. Cl. .................................... 257/684; 257/722
[58] Field of Search ...................... 357/81, 80, 68, 74

[56] References Cited

U.S. PATENT DOCUMENTS

| 4,079,506 | 3/1978 | Suzuki et al. | 29/576 W |
|---|---|---|---|
| 4,310,965 | 1/1982 | Horiuchi et al. | 29/580 |
| 4,322,737 | 3/1982 | Sliwa, Jr. | 357/81 |
| 4,630,096 | 12/1986 | Drye et al. | 357/81 |
| 4,631,804 | 12/1986 | Roy | 29/576 W |
| 4,689,659 | 8/1987 | Watanake | 357/81 |
| 4,698,662 | 10/1987 | Young et al. | 357/80 |
| 4,745,455 | 5/1988 | Glascock, II et al. | 357/81 |
| 4,774,632 | 9/1988 | Neugebauer | 361/386 |
| 4,933,746 | 6/1990 | King | 357/81 |
| 4,951,123 | 8/1990 | Lee et al. | 357/80 |
| 5,016,083 | 5/1991 | Ishii et al. | 357/80 |
| 5,049,981 | 9/1991 | Dahringer | 357/80 |
| 5,063,177 | 11/1991 | Gellen et al. | 357/80 |

FOREIGN PATENT DOCUMENTS 0211531 5/1987 European Pat. Off. .

OTHER PUBLICATIONS

Kearney, "Assembly Automation Accommodates Advanced VLSI Packaging", *Semiconductor International*, Nov. 1988, p. 38.
Sikorski et al., "A Systems Approach to the Evaluation of Packaging Design Alternatives", *The International Journal for Hybrid Microelectronics*, vol. 12, No. 2, Jun. 1989, pp. 102-110.
Collins, "Initiative fives fillip to flip chip research", *Electronics Times*, Jan. 25, 1990, p. 23.

*Primary Examiner*—Eugene R. LaRoche
*Assistant Examiner*—Viet Q. Nguyen
*Attorney, Agent, or Firm*—Ronald E. Myrick; Barry N. Young; Ronald C. Hudgens

[57] ABSTRACT

A mounting for a semiconductor chip is composed substantially of polysilicon materials and incorporates integral heat dissipating elements into its design. The mounting can be cast from molten polysilicon or machined from a block of solid polysilicon depending on the shape and complexity of design of the mounting and heat dissipating elements. Polysilicon has excellent heat transfer properties and is closely matched to silicon in its coefficient of thermal expansion thereby reducing mechanical stress between the mounting and the chip. The semiconductor chip is attached directly to the polysilicon mounting establishing a direct thermal pathway between the heat generating chip and the heatsink elements of the mounting. The configuration of using direct attachment to a polysilicon mounting creates a thermally efficient package with greatly enhanced heat transfer capabilities and reduced mechanical stress. The mounting can accommodate both single and multi-chip applications in a variety of arrangements. The packages made from polysilicon can therefore become an integral and active part of the functionality of the chip from the point of view of interconnect, signal integrity and thermal management while also improving manufacturability and long term reliability.

8 Claims, 2 Drawing Sheets

MOUNTING SILICON CHIPS

BACKGROUND OF THE INVENTION

1. Field of the Invention

The present invention relates to the mounting, encapsulation and thermal management of silicon chips.

2. Related Art

The mounting and encapsulation of semiconductor chips are the final steps in the process of manufacturing semiconductor chips. The thermal management of semiconductor chips has presented many problems in the mounting and encapsulation processes. The increasing amounts of heat generated by chips of newer design are constantly challenging the present technology to develop new materials and semiconductor package configurations designed to transfer heat more efficiently.

The internal mounting location and configuration of the chip package are extremely important in designing thermally efficient packages.

A standard technique for mounting silicon chips in semiconductor packages is to attach the chip to an alumina ceramic plate. This is sometimes done by depositing a layer of gold on the underside of the chip and on the top of the alumina ceramic plate and pressing the chip to the ceramic plate with heat. This procedure produces a low melting point gold-silicon eutectic which welds the chip to the ceramic. The alumina plate may have a raised rim, for the attachment of wire interconnections and a lid. However, the routine attachment of the chip to an internal substrate creates a thermal barrier which heat must pass through to be dissipated.

The two most significant modes of heat transfer in this context are heat conduction and heat convection. Heat conduction is the transfer of heat through a medium. Heat convection is the transfer of heat away from a hot body to an ambient mass of cooler fluid, e.g. air, generally having a constant temperature. The object in designing chip packages is to take advantage of materials with high thermal conductive properties and arrange them in configurations which best utilize heat conduction and heat convection to transfer heat away from the chip.

If the chip is likely to produce a large amount of heat, a means of efficient heat dissipation must be thermally coupled to it. The manner in which this is done depends largely upon the conditions under which the chip is to be used.

If the chip is to be used in relative isolation, then a heatsink may be attached to the opposing side of the alumina ceramic plate by an epoxy resin. The heatsink is typically aluminum and is configured with heat dissipating elements, such as fins, posts or the like, for greater surface area. The heat dissipating elements often take the form of a stack of circular fins joined together at their centers effectively forming a central rod. Heat passes from the alumina substrate, by conduction, into the heatsink and then is convected away over the surface area of the heat dissipating elements of the heatsink. Utilizing an epoxy bonded, external heatsink is effective with low power chips, however, the external addition of the heatsink creates thermal barriers at the epoxy and heatsink interconnections. These thermal barriers make the addition of an external heatsink less effective when used with relatively high power/high heat chips. Heat generated by the chip must be conducted through the internal alumina substrate to the external heatsink before it can be convected away. In this context alumina has certain disadvantages with regard to its thermal conductivity and thermal coefficient of expansion. Alumina has poor thermal conductivity which makes it a poor material for efficient heat transfer. Also alumina's coefficient of thermal expansion is not closely matched to silicon. The mismatch between expansion coefficients creates significant mechanical stresses between the silicon chip and the alumina substrate often causing defects within the chip.

In an endeavor to extend the performance limits of the type of heatsink/internal substrate configuration described, a number of alternative materials with better heat transfer properties have been proposed, such as aluminum nitride and beryllium oxide. These alternatives, however, generally have their own disadvantages. For example, aluminum nitride is expensive, and there are potential health hazards associated with beryllium compounds.

If the chip is to be mounted in combination with a number of other chips and further components, it may undergo a number of further mounting steps. For example, a packaging arrangement has been described in "A Systems Approach to the Evaluation of Packaging Design Alternatives", Sikorski, Kruger, and Field, *International Journal of Hybrid Microelectronics*, Vol. 12 No. 2, p. 102-110 (June 1989), in which the chip is mounted on an alumina leaded ceramic chip carrier (LCCC) which is thermally attached to an alumina printed wiring network (PWN) or printed circuit board (PCB) by a thermal pad of tin-lead solder, the PWN being in turn similarly soldered to a Cu/Mo/Cu carrier plate which is finally coupled to an aluminum chassis heatsink by a layer of thermal grease.

Manufacturing costs are also a major concern in designing chip mountings and packages. The conventional chip mounting and packaging techniques involve a considerable number of process and testing steps to weed out defective chips. These process and testing steps result in increased costs. The large number of steps also pose difficulties in trading off cost against effectiveness. For example, chips being mounted and encapsulated in the conventional manner, as previously described, are probe tested on the wafer, then mounted on the alumina carrier and encapsulated and tested again, then "burned in" (run for typically 24 hours at elevated temperature) and retested. This testing procedure involves several testing steps and tests the chips under abnormal conditions (without heat dissipating means attached).

SUMMARY OF THE INVENTION

In this invention semiconductor chips are attached directly to a mounting composed substantially of polycrystalline silicon (polysilicon) material.

Polysilicon materials are far superior to the prior art mounting materials, e.g. alumina, in respect to heat transfer properties and thermal coefficient of expansion. Polysilicon has a higher thermal conductivity than alumina and has a coefficient of thermal expansion that is more closely matched to the single crystal silicon material used in fabricating the chips.

The polysilicon mounting structure is a one piece mounting arrangement which incorporates integral heat dissipating elements into its configuration for increased thermal efficiency. The one piece structure creates a direct thermal pathway between the semiconductor chip and the integral heat dissipating elements allowing greatly improved heat transfer capabilities. The polysilicon mounting structure is easily processed and can take on many different forms according to the packaging needs of the specific application.

In addition, the present invention reduces the number of manufacturing steps and also enables the chips to be tested under normal operating conditions (i.e. with a heatsink attached).

In a first embodiment a one piece polysilicon mounting structure is formed in a shape geometrically similar to a combination of a rectangular carrier plate having a substantially flat surface on one side and having a heatsink with circular stacked fins extending outwardly from the opposing side.

Other arrangements of the heat dissipating elements are possible, e.g. with fins projecting outwardly perpendicular to the plane of the main plate of the mounting.

In a second embodiment a polysilicon mounting with integral heat dissipating elements is incorporated into a multi-chip arrangement. In this multi-chip arrangement the polysilicon mounting has two sets of heat dissipating elements located opposite the centers of the positions of the chips mounted on the opposing sides of the mounting.

A third embodiment encompasses the multi-chip principle in a 3 layer multi-board sandwich assembly in which each board comprises a polysilicon mounting and a ceramic carrier plate attached thereto. The outer boards carry high and low power chips and are configured with heat dissipating elements opposite the locations of the high power chips. The inner board carries only low power chips and does not need external heat dissipation. The internal board is thermally insulated from the heat of the outer boards by the ceramic carrier plates.

BRIEF DESCRIPTION OF THE DRAWING FIGURES

DESCRIPTION OF THE PREFERRED EMBODIMENTS

The crux of the present invention is to use silicon in the form of polycrystalline silicon, more commonly known as polysilicon, as the primary mounting material for a semiconductor chip, so that the chip is attached directly to a polysilicon assembly. Polycrystalline silicon may be contrasted with single crystal silicon which is used for fabricating integrated circuit chips themselves.

If it is desired to electrically isolate the chip from the mounting, an oxide layer may be formed on the underside of the chip and/or the top side of the polysilicon by conventional silicon chip processing techniques. This layer will be only several microns thick however, contrasted with the hundreds of microns of an epoxy layer.

Suitably insulated leads to and from the chip may be formed on the polysilicon mounting, e.g. by deposition, or hybrid, or thick film techniques, and the chip may then be encapsulated by means of a cover plate also made of polysilicon. For this arrangement, the chip may be accommodated in a recess in the mounting or mounted in an inverted position. The polysilicon cover plate preferably has a projecting rim by which it is attached to the mounting so as to form a cavity between it and the mounting.

The polysilicon mounting may be formed with heat dissipating elements, such as fins, posts or the like. The polysilicon mounting with integral heat dissipating elements is formed in substantially the same shape as the aluminum heatsink described above in the related art, i.e. as a stack of circular fins.

The mounting may also comprise a substantially uniform rectangular plate with the chip mounted on one side and with heat dissipating features projecting outwardly perpendicular to the opposing side. If fins are used, the fins may be tapered towards the outer edges, giving increased heat flow near their bases and thus making the temperature distribution from base to edge more nearly uniform.

Where fins are used, the fins may be arranged substantially parallel to each other. This permits good flow of cooling fluid directed parallel to the fins and parallel to the main plate of the mounting, i.e. in the same direction as the conventional cooling fluid flow across a conventional heatsink. The above features result in a simplification of the process of chip mounting and encapsulation, and allows the chips to be tested under normal operating conditions (i.e. with a heatsink attached).

Figure 1:
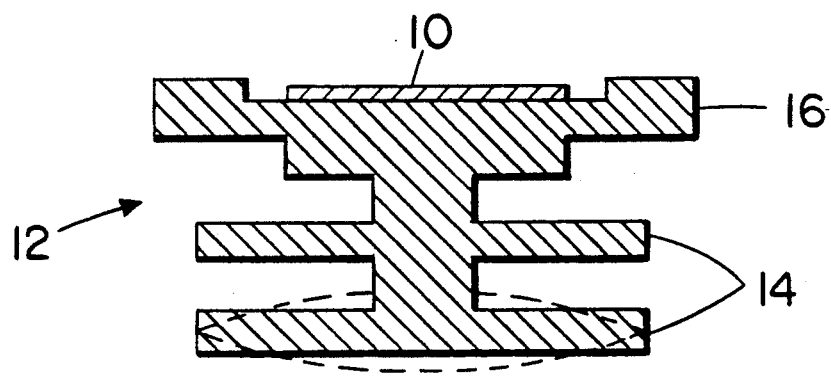
FIG. 1 is a cross sectional view of a chip mounted on a polysilicon mounting in accordance with the invention.

FIG. 1 shows a semiconductor chip 10 mounted on a polysilicon mounting 12 having integral heat dissipating elements which is formed in a shape geometrically similar to a combination of a rectangular carrier plate and a heatsink having circular stacked fins. The thermal resistance between the chip 10 and the fins 14 of the mounting is substantially less than that of a conventional arrangement where the heat must pass through the carrier plate, an epoxy bonding layer and then to the heatsink. Further in the FIG. 1 arrangement there is substantial additional heat flow from the chip to the peripheral parts of the main body 16 of the mounting, which thus acts as an additional cooling surface. The fins 14 may be tapered as shown by the broken lines.

Other arrangements of heat dissipating elements may be possible, i.e. with them projecting outwardly from the plane of the main plate of the mounting instead of, as in FIG. 1, being parallel to that plane. Where fins are used they may be parallel to each other, in which case the cooling fluid is preferably directed to flow between the fins, but may be directed at an angle to the plane of the main plate.

Preferably however fins would be arranged radially from a point opposite the center of the chip. With this arrangement, the cooling flow may be directed from any direction towards the pattern of the fins. This promotes turbulent flow of the cooling fluid. It will be realized that if the fins are substantially parallel, as proposed in the previous paragraph, turbulence can be promoted by directing the cooling fluid flow across the fins rather than between them.

The use of such perpendicular fins rather than conventional stacked fins readily results in an increased surface area of the base plate plus fins. Typically, for radially arranged perpendicular fins occupying substantially the same total volume as two stacked fins, the surface area is roughly the same for four fins, roughly 50% higher for 8 perpendicular fins, and more than doubled for 16 perpendicular fins. This increased surface area for effectively the same volume as in the prior stacked fin applications, together with the high thermal conductivity of polysilicon compared to ceramic, may reduce the need for fan assisted cooling.

A plurality of chips may be mounted on a common polysilicon substrate having a plurality of heat dissipating elements integrally formed thereon. The heat dissipating elements may then be divided into sets, one for each chip or for each chip which produces more heat than can readily be dissipated by the substrate alone, with each set of heat dissipating elements being located substantially opposite the associated chip. The size and or number of heat dissipating elements of each set may be chosen to properly dissipate the amount of heat produced by the corresponding chip.

Figure 2:
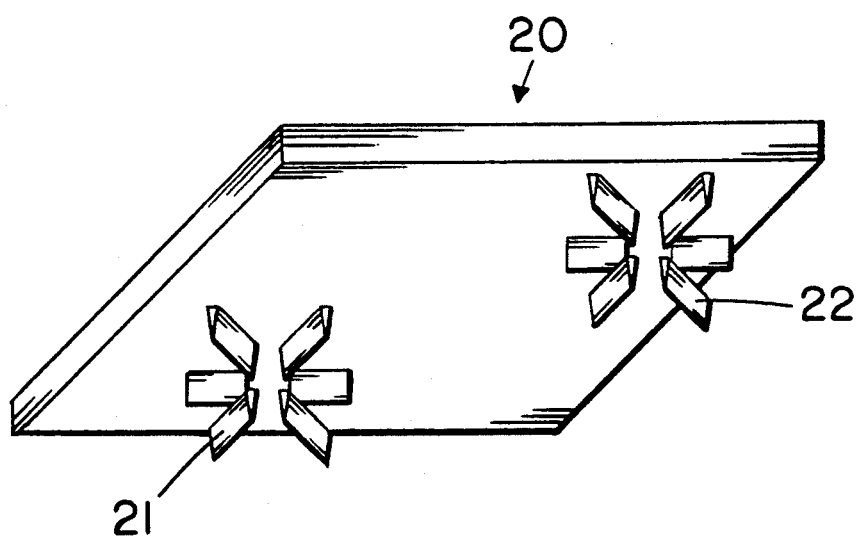
FIG. 2 is an inverted isometric view of the underside of a multi-chip polysilicon mounting in accordance with the invention.

FIG. 2 shows a view of the underside of a polysilicon mounting 20 having several chips (not shown) mounted on its upper side. Two of these chips, towards the front right and the back left, are high power chips producing considerable quantities of heat. The mounting has two sets of fins 21 and 22 formed on its underside to dissipate the heat produced by these two chips. It will be seen that the fins of each set are arranged radially, and are tapered towards their lower (outer) edges. The number and size of the fins of each set may be chosen to properly dissipate the amount of heat generated.

The polysilicon mounting may be made by various techniques. If it has no fins, or if the fins are of conventional form (stacked plates), it may be made by machining from a solid block or rod of polysilicon.

The mounting is preferably made by casting from molten silicon poured into a mold made e.g. from graphite carbon. Casting allows the upper surface of the mounting to have a well formed in it for the chip if desired.

The mounting may also be constructed as a number of separate components (each made e.g. by machining or casting) which are then soldered or welded together, for example using gold to form a low melting point eutectic with the silicon as previously described. This procedure has the advantage that it is directly compatible with the attachment of the chip or chips to the mounting.

The invention has two primary advantages. One is that the thermal resistance to heat flow from the chip is small. The thermal conductivity of polysilicon is the same as that of the chip, and there are no significant low thermal conductivity layers between the chip and the polysilicon mounting (in contrast with the conventional technique, in which there is a ceramic layer and an epoxy layer). The other advantage is that the coefficient of thermal expansion of the mounting (heatsink) is the same as that of the chip (both are silicon), so there will be very little mechanical stress on the chip. This is in contrast to chip mounting on ceramics, because there is a serious mismatch between the thermal coefficients of expansion of silicon and most ceramics (and also between silicon and aluminum). In addition polysilicon is relatively inexpensive. Further, in addition, the integral polysilicon heatsink package can have its electrical resistivity specified over a wide range, some values of which provide RF shielding, both of the signals produced by the chip and external signal which might interfere with the chip (and without affecting its thermal conductivity). Its resistivity can also be controlled locally, e.g. where the chips are attached; it can also have p-n junctions formed in at these regions for reverse biasing and hence electrical isolation of the chips. It can also act as a base plane enabling the transmission characteristics of leads from the chip to be controlled. As a base plane, it can also support and form part of discrete components, e.g. capacitors, external to the chip. It can also help to minimize the dangers of high voltage "static" damage to the chip.

Furthermore passages may be provided in the polysilicon mounting through which cooling fluid, such as a refrigerant gas or liquid, could be circulated, in situations in which heat production from the chip or chips mounted thereon is particularly high. It will be realized that silicon, particularly if its surface is oxidized, has good resistance to corrosion.

If several chips are mounted on a common polysilicon heatsink plate, they may be located in "windows" in a ceramic plate attached to it. Alternatively they may be located in recesses or wells formed in the upper surface of the polysilicon mounting, as mentioned above for a single chip. This arrangement provides a surface substantially flush with the top of the chips for carrying conductors to which the connections from the chips may be made, by wire or TAB (Tape Automated Bonding) bonding. The use of a windowed ceramic plate reduces perpendicular heat dissipation from high power chips to a lid containing low power chips.

A development of the multi-chip packaging principle is a sandwich construction, in which one layer is a polysilicon base with several high power chips, such as computing chips, on one side and having heat dissipating elements on the opposing side, and one or more further chip carriers adjacent to it carrying low power chips, such as memory chips, which therefore do not require special heat dissipation arrangements.

Figure 3:
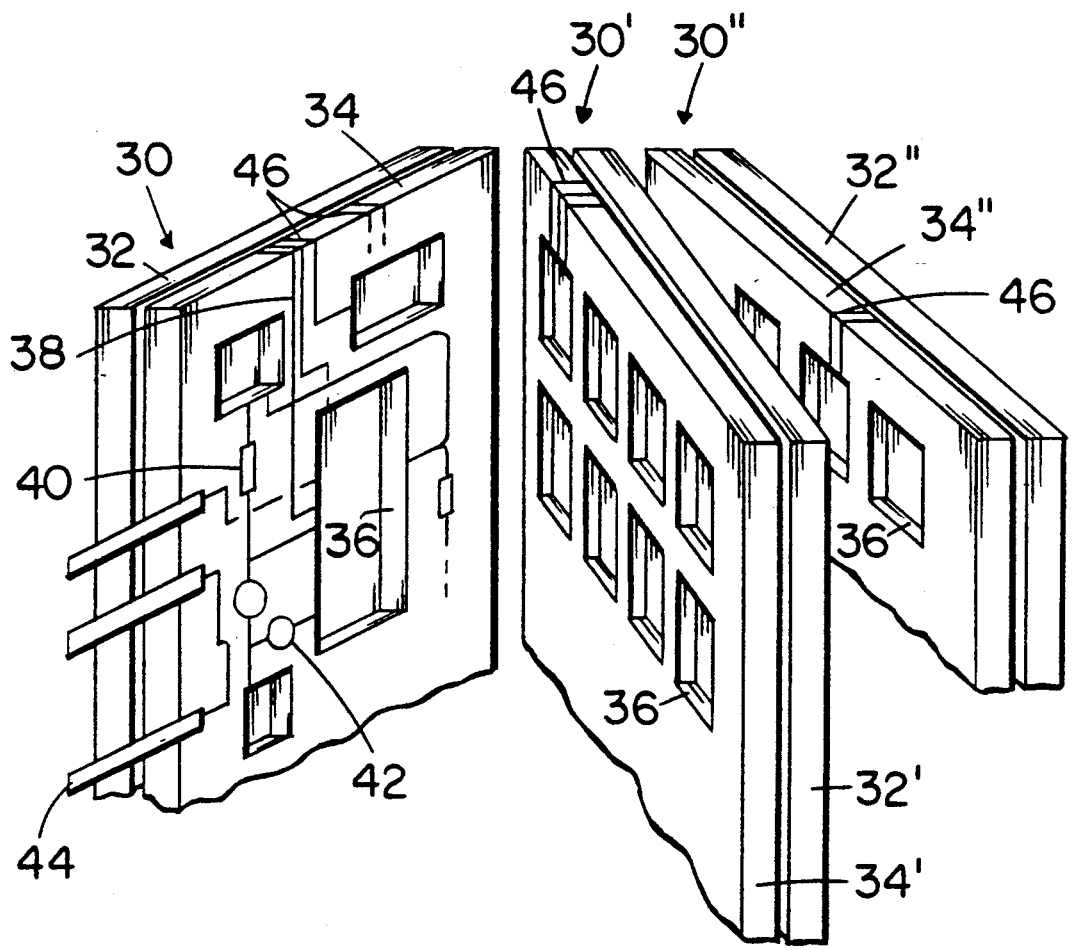
FIG. 3 is an isometric view showing a 3 layer multi-board sandwich assembly of 3 boards in which each board comprises a polysilicon mounting in accordance with the invention and a ceramic plate attached thereto.

FIG. 3 shows a 3-layer multi-board sandwich assembly of 3 "boards" 30-30", in which each board comprises a polysilicon mounting 32-32" with a ceramic plate 34-34" attached thereto. The ceramic plates have apertures 36 to contain chips (not shown), as described above, and carry multi-layer printed circuit wiring 38, components such as decoupling resistors 40 and capacitors 42, external connectors 44, and over the edge connectors 46 for connections between the boards. The use of ceramic rather than polysilicon for the apertured plates reduces the perpendicular flow of heat and thus reduces the heating of low power chips from facing high power chips.

The outer board 30 carries the high power chips, and is provided with fins (not shown) on its reverse side; the board 30' carries low power chips. The board 30", being on the outside of the assembly, can also carry high power chips and have fins attached like board 30. The boards 30-30" forming the assembly may be sealed together, e.g. by cold indium sealing, to encapsulate and protect the chips. This allows the boards to be separated again by gentle heating if necessary.

The preferred embodiment packages made from polysilicon can therefore become an integral and active part of the functionality of the chip from the point of view of interconnect, signal integrity thermal management while also improving manufacturability and long term reliability.

While there have been shown preferred embodiments, it is understood that various other adaptations and modifications will readily occur to those skilled in the art and therefore departures may be made from the specific details disclosed without diverging from the spirit and scope of the invention.

What is claimed is:

1. A semiconductor chip and heat dissipating mounting assembly comprising a semiconductor chip, a unitary mounting formed entirely of polysilicon material and carrying on one side thereof the semiconductor chip, the mounting being shaped to include a group of heat dissipating elements formed on its external surface on the side opposite the side carrying the semiconductor chip, the group of heat dissipating elements projecting outwardly of such exterior surface at a location directly opposite the semiconductor chip.

2. An assembly as claimed in claim 1, wherein said heat dissipating elements are fins which are tapered towards their outer edges.

3. An assembly as claimed in claim 2, wherein the fins are arranged substantially parallel to each other.

4. An assembly as claimed in claim 2, wherein the fins of the group are arranged on the external surface of the mounting so as to extend in a direction substantially radially from a location on the external surface positioned directly opposite from the center of the semiconductor chip.

5. An assembly as claimed in claim 4, including a plurality of semiconductor chips carried on the one side of the mounting and groups of fins on the external surface thereof, each of the groups of fins being at a location directly opposite one of the semiconductor chips.

6. A mounting for a semiconductor chip comprising:
a unitary structure formed entirely of polysilicon material having a substantially flat first surface on one side thereof and a second surface on the opposite side thereof;
said first surface having a recessed cavity with a substantially flat surface formed therein for mounting a semiconductor chip; and
said second surface being formed to have a central supporting post extending outwardly of the mounting in a direction away from and generally perpendicular to the first surface and a group of circularly shaped heat dissipating elements, said heating elements of said group being in spaced apart stacked relationship on said post and extending outwardly therefrom, said post being located at a position generally opposite said recessed cavity.

7. A mounting for a semiconductor chip as claimed in claim 6, where said circularly shaped heat dissipating elements are tapered towards their outer circumferencial edges.

8. A mounting for a semiconductor chip as claimed in claim 7, wherein said fins are arranged substantially parallel to each other.

* * * * *